(12) United States Patent
Adams

(10) Patent No.: US 7,841,293 B2
(45) Date of Patent: Nov. 30, 2010

(54) DISPLAY INSTRUMENT AND METHOD FOR PRODUCTION AND DISASSEMBLY OF A DISPLAY INSTRUMENT

(75) Inventor: Jürgen Adams, Villingen-Schwenningen (DE)

(73) Assignee: Continental Automotive GmbH, Hannover (DE)

( * ) Notice: Subject to any disclaimer, the term of this patent is extended or adjusted under 35 U.S.C. 154(b) by 738 days.

(21) Appl. No.: 11/722,252

(22) PCT Filed: Dec. 2, 2005

(86) PCT No.: PCT/EP2005/056437
§ 371 (c)(1),
(2), (4) Date: Jun. 20, 2007

(87) PCT Pub. No.: WO2006/069889
PCT Pub. Date: Jul. 6, 2006

(65) Prior Publication Data
US 2010/0000464 A1    Jan. 7, 2010

(30) Foreign Application Priority Data
Dec. 27, 2004   (DE) ................... 10 2004 062 880

(51) Int. Cl.
*G01D 11/26*   (2006.01)
*F16J 15/02*   (2006.01)
(52) U.S. Cl. ........................................ 116/305; 73/431
(58) Field of Classification Search .................. 116/305; 73/431, 866.3; 206/305; 220/23.91, 662, 220/663, 664; 324/156; 368/291, 292; 29/426.6, 29/451
See application file for complete search history.

(56) References Cited

U.S. PATENT DOCUMENTS

| 2,800,248 A | * | 7/1957 | Van Bennekom et al. ... 220/324 |
| 2,916,011 A | * | 12/1959 | Molis .......................... 116/288 |
| 3,439,543 A | * | 4/1969 | Aldeborgh ................... 73/431 |

(Continued)

FOREIGN PATENT DOCUMENTS

DE    1829824    4/1961

(Continued)

OTHER PUBLICATIONS

Thomas Bock, Low Compression Load Housing Seal, Technical Developments, vol. 17, pp. 152-153, Dec. 1992.

*Primary Examiner*—R. A. Smith
(74) *Attorney, Agent, or Firm*—King & Spalding L.L.P.

(57) ABSTRACT

A display instrument (1), in particular, for a motor vehicle, has a housing (2) retaining a cover disc (3) and a connector element (10), connecting the housing (2) and the cover disc (3) which engages in a housing recess (11), arranged on the housing (2). A secure connection of housing (2) and cover disc (3) for the display instrument (1) may be achieved, whereby the connector element (10) is arranged in the housing recess (11) and a disc recess (12), corresponding to the housing recess (11) on the cover disc (3), under tension. In the method for production of the display instrument (1), the connector element (10) is introduced under tension into the housing recess (11) and the disc recess (12) such as to connect the housing (2) and the cover disc (3) together. The method for disassembly of the display instrument (1) is based on pressing the connector element (10) out of the housing recess (11) and/or the disc recess (12).

7 Claims, 2 Drawing Sheets

U.S. PATENT DOCUMENTS

| | | | |
|---|---|---|---|
| 3,505,807 A * | 4/1970 | Piquerez | 368/291 |
| 3,694,894 A * | 10/1972 | Jelinek et al. | 29/451 |
| 3,785,142 A * | 1/1974 | Soguel | 368/291 |
| 4,306,652 A | 12/1981 | Inaba | 206/305 |
| 4,594,785 A * | 6/1986 | Carlson | 33/833 |
| 4,628,731 A * | 12/1986 | Copeland | 73/431 |
| 4,813,120 A * | 3/1989 | Fournier | 29/426.6 |
| 5,088,257 A * | 2/1992 | Loga et al. | 52/204.591 |
| 5,580,156 A * | 12/1996 | Suzuki et al. | 362/184 |
| 5,880,401 A | 3/1999 | Leischner et al. | 174/17 CT |
| 2002/0190484 A1 * | 12/2002 | Seki et al. | 277/628 |

FOREIGN PATENT DOCUMENTS

| | | |
|---|---|---|
| DE | 2133777 | 1/1973 |
| DE | G 8318915 | 3/1985 |
| DE | 4318011 | 12/1994 |
| DE | 9420291 | 11/1995 |
| DE | 19634673 | 8/1998 |
| EP | 22677 A1 * | 1/1981 |
| EP | 340773 | 11/1989 |
| JP | 08210505 A * | 8/1996 |
| JP | 08254273 A * | 10/1996 |
| JP | 2007009905 A * | 1/2007 |

* cited by examiner

US 7,841,293 B2

DISPLAY INSTRUMENT AND METHOD FOR PRODUCTION AND DISASSEMBLY OF A DISPLAY INSTRUMENT

CROSS-REFERENCE TO RELATED APPLICATIONS

This application is a U.S. national stage application of International Application No. PCT/EP2005/056437 filed Dec. 2, 2005, which designates the United States of America, and claims priority to German application number 10 2004 062 880.7 filed Dec. 27, 2004, the contents of which are hereby incorporated by reference in their entirety.

TECHNICAL FIELD

The invention relates to a display instrument, in particular for a motor vehicle. The invention further relates to a method for production of a display instrument, in particular for a motor vehicle, wherein a cover disk is connected to a housing, and to a method for disassembly of a display instrument, in particular for a motor vehicle, wherein a cover disk is separated from a housing.

BACKGROUND

Such a display may comprise a housing retaining a cover disk and a connector element connecting the housing and the cover disk, which connector element engages in a housing recess, arranged in the housing.

In general, an aforementioned display instrument is known as a combination display instrument for motor vehicles. It has a housing, which accommodates the analog and/or digital displays, which are visible to an observer, usually at least the vehicle driver, through a flat or curved cover disk. In common parlance, the cover disk is also referred to as a cover glass, although the material of this covering component is not restricted to glass and is regularly a synthetic material. In order to produce a secure and airtight connection between cover disk and housing, cover disk and housing are glued or welded together, for example by means of friction or ultrasonic welding.

Furthermore, a display instrument for motor vehicles is known, which has a housing with a front bezel retaining a cover disk, and a spacer element arranged between cover disk and front bezel as a connector element. The spacer element is placed in an axial recess arranged in a peripheral area of the front bezel and facing towards the cover disk, in which the cover disk can engage. The cover disk is retained in the front bezel and therefore in the housing by gluing the spacer element, cover disk and front bezel, or by clipping the cover disk and front bezel to cover the spacer element.

With both display instruments described above, removal and subsequent reassembly without damage is not possible.

Other solutions for connecting a disk to a bezel or a housing, which solutions use profile elements that are put over and encircle the disk with the help of a threading means, are less suitable, particularly for display instruments in motor vehicles, as they have a high space requirement.

SUMMARY

According to various embodiments, a display instrument of the kind mentioned in the introduction, can be created which has a reliable, releasable and reproducible connection between cover disk and housing. According to some embodiments, a method of the kind mentioned in the introduction for production of a display instrument, can be specified which has an aforementioned connection. Further, according to some embodiments, a method of the kind mentioned in the introduction can be specified for disassembly of a display instrument with an aforementioned connection.

According to various embodiments, the connector element is arranged in the housing recess and a disk recess of the cover disk corresponding to the housing recess under tension.

In this way, an airtight connection between housing and cover disk can be guaranteed so that the inside of the display instrument is protected against environmental influences, in particular dust and moisture. The display instrument according to various embodiments is therefore very reliable in operation and has a long service life.

According to an embodiment, a display instrument may comprise a housing retaining a cover disk and a connector element connecting the housing and the cover disk, wherein the connector element engages in a housing recess arranged in the housing, and the connector element is arranged in the housing recess and a disk recess of the cover disk corresponding to the housing recess under tension.

According to another embodiment, a method for production of a display instrument, may comprise the steps of connecting a cover disk to a housing, and subsequently introducing at least a first partial area of a connector element under tension into a housing recess of the housing, placing the cover disk and the housing together, and introducing a second partial area of the connector element under tension into a disk recess of the cover disk corresponding to the housing recess so as to connect the housing and the cover disk together.

According to another embodiment, a method for production of a display instrument, may comprise the steps of connecting a cover disk to a housing, and subsequently introducing at least a first partial area of a connector element under tension into a disk recess of the cover disk, placing the cover disk and the housing together, and introducing a second partial area of the connector element under tension into a housing recess of the housing corresponding to the disk recess so as to connect the cover disk and the housing together.

According to another embodiment, a method for disassembly of a display instrument may comprise the steps of separating a cover disk from a housing, and pressing a connector element arranged under tension in a disk recess of the cover disk and/or a housing recess of the housing out of the disk recess and/or out of the housing recess while bringing about a separation of housing and cover disk.

BRIEF DESCRIPTION OF THE DRAWINGS

An exemplary embodiment of the invention is shown schematically in the drawing and is described in more detail below. In the drawing

Corresponding elements in the different figures are given the same references.

DETAILED DESCRIPTION

Figure 1:
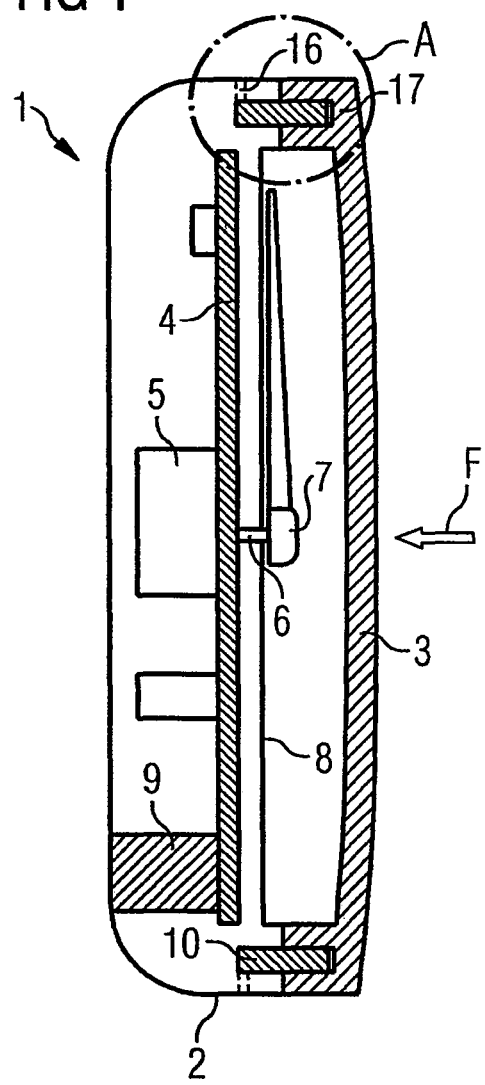
FIG. 1 shows a sectional view of a display instrument.

It may be particularly advantageous to provide a reliable friction connection between housing and cover disk, and it may not be necessary to provide an interlocked or bonded connection. In addition, housing and cover disk, which can be flat or curved, can be easily separated from one another; all that may be necessary for this is to overcome the tension in the connector element. Damage to housing and/or cover disk is avoidable, and subsequent reassembly can be carried out. This then proves to be an advantage especially when the cover disk of the display instrument is damaged, in particular scratched, and has to be replaced. In contrast to the conventional solutions, which in such a case disadvantageously require the whole display instrument to be removed, from a vehicle for example, with various embodiments, it is possible to remove the cover disk and to fit a new cover disk without damaging and/or removing the housing and without disconnecting electrical connections, in particular from the display instrument. Due to the tension and the associated clamping effect of the connector element, in a double function a reliable sealing of the cover disk on the one hand and a secure retention of the cover disk in the housing on the other is ensured. With the display instrument according to various embodiments, therefore, apart from the connector element, no further (constructional) elements such as clips or glued joints, for example, are needed either for sealing or retaining the cover disk. Preferably, the connector element sits both in the housing recess and also in the disk recess with a slight interference fit.

According to an embodiment, the housing recess is constructed in the form of a housing slot with a U-shaped cross section and/or the disk recess as a disk slot with a U-shaped cross section. In this way, the recesses can be particularly easily produced without increasing the manufacturing effort when the cover disk and/or the housing are a plastic injection-molded part.

It could be envisaged that recesses are only arranged in certain areas and in sections in the housing and/or cover disk. On the other hand, the connector element can be more easily inserted into the recesses when, according to another embodiment, the housing recess is arranged circumferentially in an edge region of the housing and/or the disk recess circumferentially in an edge region of the cover disk. Preferably, both the disk recess and the housing recess are constructed circumferentially, and the connector element is arranged in the recesses over their whole length. By this means, it is ensured that the display instrument is very well sealed.

As a basic principle, the disk recess and the housing recess can be aligned roughly parallel to a plane defined by the cover disk, for example. However, a particularly easy assembly and disassembly of the display instrument is achieved in that, according to another embodiment, the housing recess and the disk recess are axial recesses, which are aligned parallel with the direction of a joint between housing and cover disk.

The reliability of the display instrument seal and the service life of the connection between cover disk and housing are advantageously increased in that, according to another embodiment, the connector element comprises a permanently elastic material. Advantageously, the connector element is formed by a rubber or silicone ring.

According to another embodiment, the housing has a ventilation hole connecting the housing recess to a housing surface facing away from the cover disk, and/or the cover disk has a ventilation hole connecting the disk recess to a disk surface facing away from the housing. On the one hand, this can prevent a volume of air enclosed in the recess by the connector element from hindering the seating of the connector element, and, on the other, the connector element can be sucked into the respective recess, for example by evacuation or venting of the recess through the ventilation hole.

Also, when the connector element lies on the floor of the housing and/or disk recess, further venting, in particular to a ventilation hole, can take place, when according to an embodiment, a ventilation channel is arranged on a floor of the housing recess and/or on a floor of the disk recess. This can prevent the—possibly elastic—connector element from prematurely sealing a section of the recess and thus interfering with a uniform arrangement of the connector element in the recess.

The fitting of the connector element can be made considerably easier in that, according to another embodiment, the housing recess has a widened section at its transition to the housing surface and/or the disk recess has a widened section at its transition to the disk surface.

According to various embodiments of a method, subsequently at least a first partial area of a connector element is introduced under tension into a housing recess of the housing, the cover disk and the housing are placed together, a second partial area of the connector element is introduced under tension into a disk recess of the cover disk corresponding to the housing recess so as to connect the housing and the cover disk together. Also, in a method subsequently at least a first partial area of a connector element is introduced under tension into a disk recess of the cover disk, the cover disk and the housing are placed together, a second partial area of the connector element is introduced under tension into a housing recess of the housing corresponding to the disk recess so as to connect the cover disk and the housing together.

Both of the aforementioned methods, which differ in the sequence of the method steps, enable a display instrument to be assembled cost effectively and in a very simple manner without elaborate manufacturing equipment. The methods are particularly suitable for production of a display instrument according to various embodiments described above.

For example, it could be envisaged that the connector element is squeezed into the recesses by means of directly applied mechanical pressure when pushing the housing and cover disk together. On the other hand, the risk of damaging the connector element is particularly low when, according to an embodiment, the connector element is sucked into the housing recess and/or into the disk recess. The sucking-in can preferably be carried out by sucking out air from the recess or recesses, for example by applying a vacuum. In doing so, the connector element can deform when being sucked into the recess so that its cross-section reduces in size with a consequential buildup of mechanical compressive stress. The final seating of the connector element can then advantageously be achieved when the connector element comes into contact with a floor of the respective recess.

According to various embodiments, a connector element arranged under tension in a disk recess of the cover disk and a housing recess of the housing is pressed out of the disk recess or out of the housing recess while bringing about a separation of housing and cover disk.

Preferably and cost-effectively, the pressing-out can be undertaken using compressed air. With various embodiments, projections, hooks, recesses or similar elements on the cover disk are not necessary; a direct attack on the cover disk or on the housing is not necessary when disassembling the display instrument. The method is particularly suitable for disassembly of a display instrument according to various embodiments described above.

FIG. 1 shows a display instrument 1 of a motor vehicle in a side view with a housing 2 and a curved cover disk 3, which covers the housing 2 on the side facing an observer and which is made of a transparent plastic, for example PMMA (polymethylmethacrylate). The cover disk 3 is fitted in a replaceable manner on the housing 2 for maintenance purposes or for replacement, for example. In the housing 2 is arranged a printed circuit board 4, which carries various electrical and electronic components, including a pointer drive 5 by means of which a pointer 7 can be moved via a pointer shaft 6.

Associated with the pointer 7 is a scale on an instrument dial for indicating a road speed or engine speed of the motor vehicle for example. The printed circuit board 4 has an equipment plug 9 on its rear side for making electrical contact.

Figure 2:
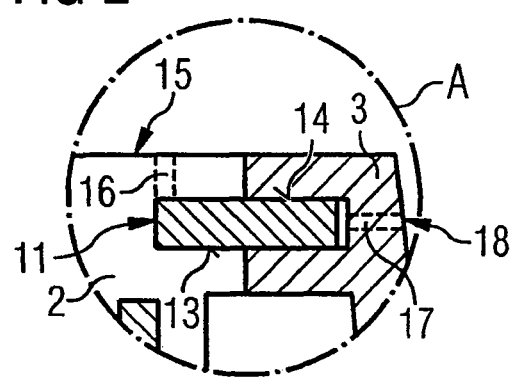
FIG. 2 shows an enlarged detail of the display instrument shown in FIG. 1.

The cover disk 3 is retained on the housing 2 by means of an elastic connector element 10 with a rectangular cross-section, preferably a rubber ring. In conjunction with FIG. 2, which shows an enlarged view of a detail A from FIG. 1, it is clear that the connector element 10 engages in a housing recess 11 arranged in the housing 2 as well as in a disk recess 12 in the cover disk 3 corresponding with the housing recess 11. The housing recess 11 is constructed in the form of a housing slot 13 with a U-shaped cross-section and the disk recess 12 as a disk slot 14 with a U-shaped cross-section.

The housing slot 13 and the disk slot 14 are arranged circumferentially in an edge region of the housing 2 and the cover disk 3 respectively (cf. FIG. 1). The connector element 10 is arranged under tension both in the housing slot 13 and in the disk slot 14. The housing slot 13 and the disk slot 14 are axial recesses, which are aligned parallel with the direction of a joint between housing 2 and cover disk 3 symbolized by an arrow F.

The housing 2 has a ventilation hole 16, which connects the housing recess 11 to a housing surface 15, which faces away from the cover disk 3, i.e. toward the outside. A further ventilation hole 17 is provided in the cover disk 3, namely in such a way that the ventilation hole 17 connects the disk recess 12 to a disk surface 18, which faces away from the housing 2, i.e. toward the outside.

Figure 3:
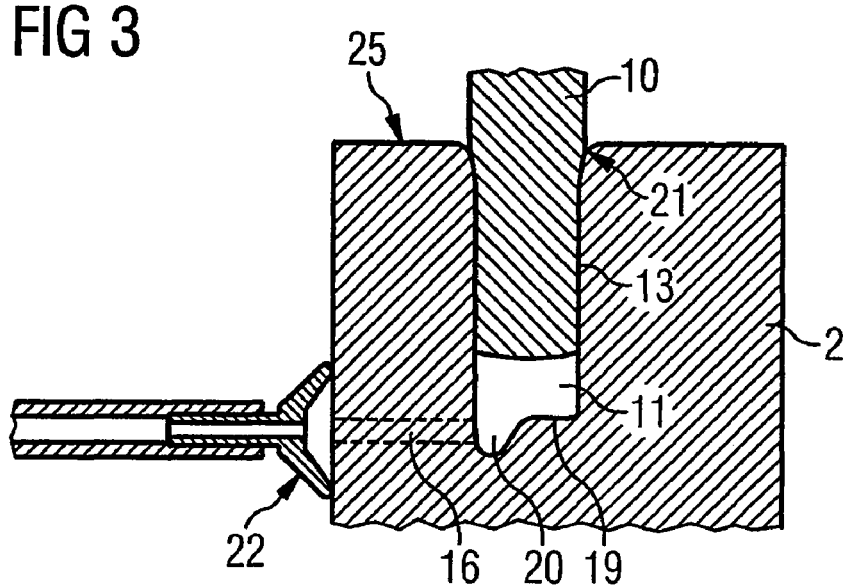
FIG. 3 shows another detail of the display instrument shown in FIG. 1 with an assembly tool.

A section of the housing 2 with the connector element 10 arranged in the housing slot 13 is shown in a detail view in FIG. 3. The housing slot 13 has a widened section 21 at its transition to a housing surface 25 facing the cover disk, and is provided with a ventilation channel 20 in its slot floor 19. The ventilation hole 16 of the housing 2 is connected to the ventilation channel 20. An assembly tool 22 designed in the form of a suction adapter with a hose to a vacuum source and placed in front of the ventilation hole 16 is used to evacuate the housing recess 11, as a result of which the connector element 10 can be sucked into the housing slot 13.

Figure 4:
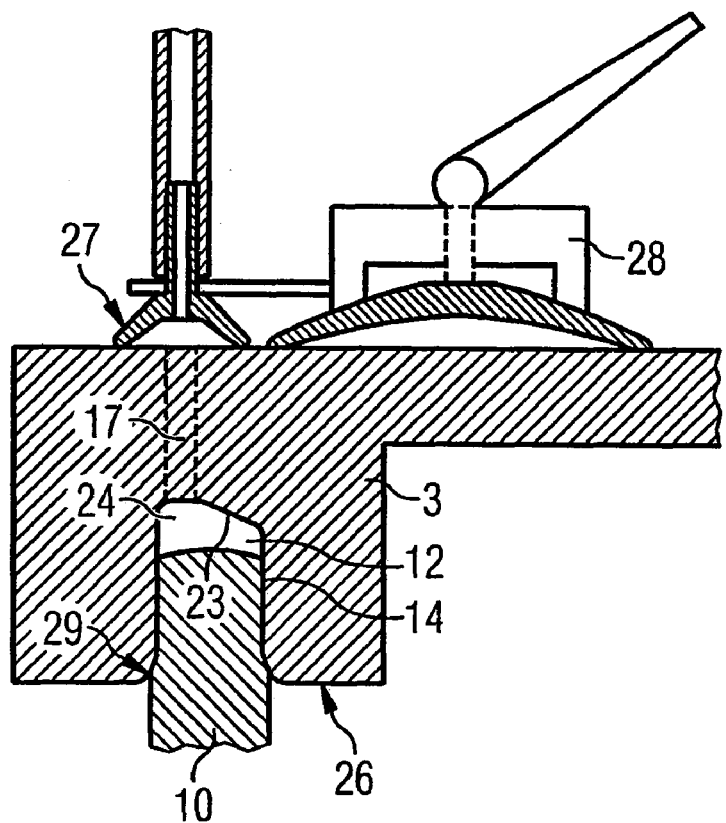
FIG. 4 shows a further detail of the display instrument shown in FIG. 1 with a disassembly tool.

A section of the cover disk 3 with the connector element 10 arranged in the disk slot 14 is shown in a detail view in FIG. 4. In its slot floor 23, the disk slot 14 has a ventilation channel 24 to which the ventilation hole 17 is connected. Further, the disk slot 14 has a widened section 29 at its transition to a disk surface 26 facing the housing. A first disassembly tool 27 is placed in front of the ventilation hole 17, which is designed in the form of a suck-and-blow adapter with hose to a vacuum source and a compressed air source, so that the connector element 10 can be pressed out of the disk slot 14 by introducing compressed air into the disk recess 12. The first disassembly tool 27 is connected to a second disassembly tool 28, which is designed as a suck-and-hold element for supporting the first disassembly tool 27 and for removing the cover disk 3. Assembly and disassembly of the cover disk 3 can be carried out in the installed state of the display instrument in the motor vehicle.

What is claimed is:

1. A display instrument comprising a housing retaining a cover disk and a connector element connecting the housing and the cover disk, wherein:
    the connector element engages in a housing recess arranged in the housing,
    the connector element is arranged in the housing recess and a disk recess of the cover disk corresponding to the housing recess under tension, and
    the housing recess and the disk recess are axial recesses, which are aligned parallel with the direction of a joint between housing and cover disk.

2. The display instrument according to claim 1, wherein a ventilation channel is arranged on a floor of the housing recess and/or on a floor of the disk recess.

3. A display instrument comprising a housing retaining a cover disk and a connector element connecting the housing and the cover disk, wherein:
    the connector element engages in a housing recess arranged in the housing,
    the connector element is arranged in the housing recess and a disk recess of the cover disk corresponding to the housing recess under tension, and
    the housing has a ventilation hole connecting the housing recess to a housing surface facing away from the cover disk, and/or the cover disk has a ventilation hole connecting the disk recess to a disk surface facing away from the housing.

4. A method for connecting a cover disk to a housing during the production or repair of a display instrument, comprising the steps of:
    introducing at least a first partial area of a connector element under tension into a housing recess of the housing,
    placing the cover disk and the housing together, and
    introducing a second partial area of the connector element under tension into a disk recess of the cover disk corresponding to the housing recess so as to connect the housing and the cover disk together;
    wherein the connector element is sucked into the housing recess and/or into the disk recess.

5. A method for connecting a cover disk to a housing during the production or repair of a display instrument, comprising the steps of:
    introducing at least a first partial area of a connector element under tension into a disk recess of the cover disk,
    placing the cover disk and the housing together, and
    introducing a second partial area of the connector element under tension into a housing recess of the housing corresponding to the disk recess so as to connect the cover disk and the housing together.

6. The method for production of a display instrument according to claim 5, wherein the connector element is sucked into the housing recess and/or into the disk recess.

7. The method according to claim 5, wherein the display instrument is for a motor vehicle.

* * * * *